July 2, 1968
E. R. BEAVER, JR., ETAL
3,391,030
GRAPHITE CONTAINING SEGMENTED THERMOELEMENT
AND METHOD OF MOLDING SAME
Filed July 28, 1964
3 Sheets-Sheet 1

INVENTORS
EMIL R. BEAVER, JR.
ROBERT G. AULT
BY
Mary B. Moshier
ATTORNEY

INVENTORS:
EMIL R. BEAVER, JR.
ROBERT G. AULT
BY
Mary B. Moshier
ATTORNEY

July 2, 1968 E. R. BEAVER, JR., ETAL 3,391,030

GRAPHITE CONTAINING SEGMENTED THERMOELEMENT AND METHOD OF MOLDING SAME

Filed July 28, 1964 3 Sheets-Sheet 3

INVENTORS:
EMIL R. BEAVER, JR.
ROBERT G. AULT.
BY Mary B. Moshier
ATTORNEY 3,391,030
Patented July 2, 1968

3,391,030

GRAPHITE CONTAINING SEGMENTED THERMOELEMENT AND METHOD OF MOLDING SAME

Emil R. Beaver, Jr., Tipp City, and Robert G. Ault, Trotwood, Ohio, assignors to Monsanto Research Corporation, St. Louis, Mo., a corporation of Delaware Filed July 28, 1964, Ser. No. 385,648
12 Claims. (Cl. 136—203)

ABSTRACT OF THE DISCLOSURE

A segmented thermoelement in which each segment has a different temperature to figure of merit ratio and in which a segment is bonded to another segment by a thin layer of graphite that serves not only as a bond but also as a barrier to the migration of the thermoelectric material of one segment to the other segment. An example of an n-type thermoelement for high temperature operation is silicon/carbon bonded by the graphite layer to n-type silicon/germanium. Boron/carbon bonded by the graphite to p-type silicon/germanium is an example of a high temperature p-type thermoelement. The hot and cold ends of the thermoelement may be of graphite.

Figure 1:
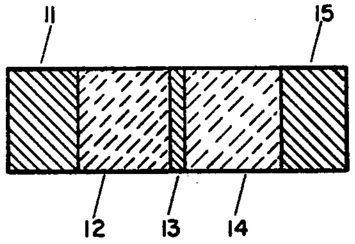

This invention relates to power generating devices and the like and more particularly relates to means of converting thermal energy into electrical energy in thermoelectric generators and cooling devices. More specifically, the invention provides new and valuable thermoelements and thermoelectric, thermionic or fuel cell power-generating devices in which the new thermoelements are used.

In accordance with the Seebeck effect, electromotive force is produced when one thermoelectric element is joined to a dissimilar thermoelectric element to form a circuit and their two junctions are maintained at different temperatures. This effect is utilized in thermoelectric generators, whereby electrical power is generated when heat is applied at one junction and rejected at the other.

For environmental cooling, rather than generation of electricity, there is utilized the Peltier effect wherein the above described circuit of dissimilar thermoelectric materials is also used. However, instead of applying heat at one junction and rejecting it at another, an electrical current is passed through the circuit causing cooling at one junction and heating at another. A transfer of heat from the ambient environment and through the device is thus effected, resulting in refrigeration.

In thermoelectric generators and other devices which are dependent on either the Seebeck effect or the Peltier effect, one junction must be maintained at a temperature which is higher than that of another; hence, the two junctions are commonly referred to as either the hot junction or the cold junction. Whether the device be based on the Seebeck or Peltier effect, its efficacy depends not only upon the nature of the thermoelement which is employed, but also upon the temperature difference of the two junctions. The greater such difference, the greater is the efficiency of either the electrical power generation or cooling device, irrespective of the composition of the thermoelements.

Much effort has been expended at preparing thermoelectric materials having a high Seebeck coefficient, low electrical resistance and thermal conductivity in order to thus attain the highest possible figure of merit, and thereby there have been provided for this purpose many semiconducting materials. Some of them withstand very high temperatures, i.e., they are neither broken down nor oxidized when heated to temperatures of, say, 800° C. to 2000° C. As the temperature is increased at the hot junction there is a proportionate increase in the quantity of energy withdrawn from the thermoelements, so long as the temperature at their cold junctions is held constant. In order to obtain maximum efficiency, the Carnot efficiency factor $$T_2-T_1/T_2$$

where $T_2$ is the hot junction absolute temperature and $T_1$ is the cold junction absolute temperature, should be as high as possible.

A practical limitation is the effect of temperature on the thermoelectric properties of the thermoelectric material. In determining the efficacy of the material, there is used the following relationship, wherein Z is the figure of merit:

$$Z=\frac{S^2}{\rho K}$$

in which S is the Seebeck coefficient, $\rho$ is the electrical resistivity and K is the thermal conductivity. The higher the figure of merit, the better the efficacy. Electrical resistivity and thermal conductivity should thus be as low as possible and the Seebeck coefficient as high as possible. However, with many thermoelectric materials the figure of merit is a function of temperature. On the other hand, because the Carnot efficiency factor demands the greatest possible temperature difference, exposure of the thermoelement to variation in temperature is necessary. Accordingly, much effort has been expended at providing thermoelements having a substantially constant figure of merit over a broad temperature range. One way of attacking the problem has been to prepare segmented thermoelements, i.e., elements consisting of two or more thermoelectric materials. The materials are positioned in the thermoelement at portions where the temperatures to which they will be exposed will be those that favor the highest figure of merit.

If the figure of merit of the thermoelectric material decreases with increase in temperature, then such a material should, of course, be positioned at a point in the device where it is exposed only to the temperature at which optimum properties occur. The relationship of temperature to figure of merit, commonly referred to as the temperature to figure of merit ratio, is readily determined for each thermoelectric material by routine testing. To provide an element suitable for operation at, say, 1200° C., a material should be used in proximity to the heat source which has high figure of merit at 1200° C. At a more remote distance from the heat source, a second material which deteriorates at 1200° C., but which is stable at 800°–600° C. can be used, since at the latter temperature range it has a high figure of merit. At an even more remote distance, another material which is stable at and has a high figure of merit at lower temperature, say, at 600° C. to 400° C., may make up a third segment of the thermoelement. The resulting element will thus consist of segments of three diverse thermoelectric materials positioned to give along the element a gradient in the temperature to figure of merit ratio of said materials.

The fabrication of efficient segmented elements has presented many obstacles. Thermoelectric materials generally comprise a matrix of a semi-conducting element, alloy, or compound containing one or more dopants to give "n" or "p" thermoelectric property. When it is attempted to hot-press layers of the diverse materials in powdered form, the heat which is required for compacting one of the materials may necessarily be so high that it causes the other thermoelectric material to melt and diffuse into the first. Hence the desired gradation is not attained. Like phenomena occur when previously molded or compacted solid pieces are hot-pressed. In order for jointing to occur, one of the pieces must soften at the interface. This may result not only in diffusion of the one thermoelectric into another, but also may often bring about a chemical reaction between components of the element to give a substance at the joint which has changed properties, e.g., a higher electrical resistivity than that of the originally employed thermoelectrics. Also, in many instances, the joint may be mechanically inadequate and/or show poor resistance to thermal shock.

During operation of thermoelectric devices comprising prior segmented thermoelements a very troublesome factor has been instability of the thermoelectric materials therein owing to migration of a component of one material into the adjacent material. As current flowed through the segmented element a portion of a thermoelectric was introduced into the other thermoelectric, thus making for lack of uniformity of each thermoelectric and consequent decrease in efficacy. Although barriers, i.e., insertions of material between the thermoelectrics for the purpose of limiting such migration have been somewhat useful in alleviating the problem, prior barriers could not be readily joined to the thermoelectric materials without resort to the use of cements. Therefore, in arriving at the efficacy of the entire element, it was necessary to take into account the effect of not only the thermoelectric property of the barrier but also of the cement. Cements of low resistivity at the useful temperatures were rarely available, if at all.

Accordingly, an object of this invention is the provision of improved, segmented thermoelectric elements of utility in power generating apparatus such as thermoelectric generators or refrigerants. Another object is the provision of an efficient method for the joining together of segments of materials having diverse thermoelectric properties. Still a further object is the provision of a thermoelectric element comprising a shaped body of diverse thermoelectric materials bonded together with a layer of material having low electrical resistance and serving as a diffusion barrier. An important objective is the provision of a segmented thermoelectric element having resistance to thermal shock. A most important objective is the provision of improved thermoelectric devices capable of operating within wide temperature ranges over long periods of time.

These and other objects hereinafter disclosed are attained by the present invention wherein there is provided a thermoelectric element, suitable for use in a thermoelectric device, comprising a shaped body having segments of at least two different thermoelectric materials bonded together by a layer of graphite carbon or graphite/carbon mixture, hereinafter referred to as graphite.

The graphite serves not only as a bond, but also as a barrier layer. The thermoelectric materials may comprise any solid material having thermoelectric properties. Examples of some suitable high temperature thermoelectrics for p-type elements are the boron-based materials disclosed in the C. M. Henderson et al., U.S. Patent No. 3,087,002, e.g., combinations of boron with one or more of the elements; carbon, silicon, aluminum, beryllium, magnesium, germanium, tin, phosphorus, titanium, zirconium, hafnium, cobalt, manganese and the rare earths of type 4*f*, particularly carbon. The boron-based thermoelectrics are characterized by an unusually high stability of the Seebeck coefficient at elevated temperatures and are thus useful as thermoelectric power generating substances at temperatures far above those at which conventional semiconductors may be employed. Boronated graphite, such as that disclosed, for example, in the R. D. Westbrook et al. Patent No. 2,946,835, or platinum-rhodium alloy or silicon carbide are other examples of thermoelectric materials which are useful for obtaining electricity from heat sources well above, say 1000° C. Thermoelements made of silicon and carbon which may or many not be in stoichiometric proportions required for silicon carbide are generally suitable as n-type elements for high temperature operation. To such highly heat-resistant materials are bonded, through graphite, thermoelectrics which are ineffective at these high temperatures but which do serve to produce electricity at lower temperatures.

The thermal gradient across the entire thermoelement assembly can be optimized by judicious choice of thermoelectric material for segments thereof. Thus a segment of the boron-based material may be joined through graphite to a segment of a less heat-resistant semi-conductor such as an indium phosphide or arsenide, a lead or bismuth telluride or a silicon-germanium alloy, etc. The thermoelement may consist of any number of segments of diverse thermoelectric materials positioned to give along the thermoelement a gradient in the temperature to electrical resistivity ratios of said materials and having a layer of graphite interposed between at least two of the segments and bonding the two segments together. Although some of the components of the thermoelectric material may diffuse into the layer of graphite, such diffusion is either minimal or inconsequential, since the electrical resistance of the graphite layer is not substantially affected. With graphite, bonds of great mechanical strength and resistance to thermal shock are achieved to an extent which has not been found to be previously obtainable. Thus, in a series of experiments wherein a powdered, boron-based thermoelectric material was hot-pressed directly to metals such as chromium, titanium or hafnium, only low-strength bonds were produced; and while good bonding was obtained with tantalum or columbium, the thermoelements thus produced exhibited poor thermal expansion properties even at very low heating rates, say, at rates as low as 50° C./minute. In many instances, segmented elements, formed by compacting at high temperatures and pressure, fracture from thermal shock during cooling. Such difficulties are not encountered when graphite is employed as the bonding layer.

Fabrication of the graphite-bonded, segmented thermoelement is readily conducted by compacting the components under heat and pressure into a shaped mass. The pressing and heating is preferably performed by the so-called "hot-pressing" operation, wherein pressure and temperature are applied simultaneously to a die containing the thermoelement components. Depending upon the thermal properties of the thermoelectric materials, the hot-pressing is conducted either in one operation or step-wise. Thus, where the thermoelectric materials are heat-stable over substantially the same temperature range, the die is charged with alternating layers of graphite and the comminuted thermoelectric materials and the die with its contents is heated while holding it under pressure. When the thermoelectric materials possess substantially different thermal stabilities, a die may be charged with a layer of the particulated thermoelectric and a layer of graphite, and the resulting assembly may be hot-pressed to give a solid piece to which, either in the same or different die, there is jointed a second and less thermally stable thermoelectric by placing the latter adjacent to the graphitic layer of the first piece and then heating and pressing the three-tiered assembly under conditions which are favorable to said second thermoelectric, i.e., at a temperature and pressure which will cause the second thermoelectric to fuse or sinter without decomposition. Segmented thermoelements containing any number of alternating layers of thermoelectric material and graphite may thus be formed.

Advantageously, segments of junction materials, may be joined to the thermoelectric materials at opposite ends of the thermoelement. Thus, the hot junction end of the element may consist of an electricity and heat conducting material such as a molybdenum alloy, or graphite and the cold junction end may be formed of the same or less-heat resistant material, e.g., aluminum, nickel or copper. Graphite may be used for both junctions, since it is readily available and easily machined and can be joined to one end of thermoelectric layer while the graphite barrier layer is being joined to the other end. Also, advantageously at the graphite cold end, copper or another metal of like thermal properties may be fixed to the graphite by screwing or pegging, since the graphite is easily worked with. The fixed copper, to which electrical leads are attached, thus serves as the effective cold end, further heat being dissipated to give increased $\Delta T$ values.

For a better understanding of the invention, reference should be made to the drawings and detailed descriptions which follow.

In FIGURE 1, there is shown one form of a thermoelement having a diffusion barrier and both junction ends of graphite. It is made as follows: Graphite disk 11 is placed at the bottom of a cylindrical die, a layer of finely comminuted thermoelectric material 12 is placed on top of graphite disk 11 and then covered with graphite disk 13 which is used as a male die plunger for compacting the thermoelectric material. The die and its contents are transferred into an induction coil assembly and heated under pressure at a temperature sufficient to fuse or sinter the thermoelectric material and insufficient to decompose it. The die and its contents are now allowed to cool and a layer of another thermoelectric material 14 is placed on top of disk 13 and covered with disk 15. After compacting as before, the die and its contents are again heated under pressure, this time, at a temperature and pressure which is sufficient to fuse or sinter the thermoelectric material 14 without decomposition, the thermal stability of the thermoelectric material 14 being substantially less than that of material 12. The die is then cooled and the now unitized assembly is removed from the die. It is a strong, well joined, segmented thermoelement wherein the hot junction has been formed of disk 11 and the cold junction from disk 15, and segments of the thermoelectric materials 12 and 14 have been joined by means of disk 13, which disk serves not only to unite the layers of materials 12 and 14 but also as a barrier layer between said materials.

The thermoelement depicted in FIGURE 1 can also be made in a single hot-pressing step when the thermal stabilities of materials 12 and 14 are substantially the same. In such a case, a cylindrical die is simply charged successively with graphite disk 11, thermoelectric material 12, disk 13, thermoelectric material 14 and finally disk 15, with mechanical compacting being used, if desired, after insertion of the intermediate and final disks. The die and its contents is then submitted to pressure and heating.

Depending upon the nature of the thermoelectric materials, the presently provided graphite-bonded thermoelements may be either of the p- or n-type. Usually the segment of thermoelectric will consist of a matrix of a semi-conducting material which has dispersed therein minor quantities, say, in the order of from about $1 \times 10^{-13}$ to 10 percent by weight of an additive which will determine the positive or negative characteristics of the element. Such additives are commonly referred to as p- or n-type dopants. Numerous examples of p- or n-type thermoelectric materials are disclosed, for instance, in the Henderson et al., Patent Nos. 3,081,361–5, 3,087,002 and 3,127,286–7, the Fritts Patents Nos. 2,811,571 and 2,896,-005, the Cornish Patents Nos. 2,977,400 and 3,110,629, the Heikes Patent No. 2,921,973, etc.

The thermoelement of FIGURE 1 may preferably be cylindrical, but it will be understood that the presently provided elements may be of any desired shape in cross section, e.g., square or polygonal or sheeted.

Thermoelements having any number of segments, with graphite barriers disposed between any or all of the segments, may be fabricated. The number of hot-pressing steps will be determined by the thermal stability of the various thermoelectric materials. The pressing should be conducted under conditions at which consolidation of the thermoelectric material occurs but at which there is substantially no decomposition of said material.

Segmented thermoelements are also conveniently made by hot-pressing a thermoelement portion having two or more segments joined by a barrier layer of graphite and then uniting two or more of such portions by pressing them together. Thus one portion may be the thermoelement shown in FIGURE 1. The second portion may be fabricated like the thermoelement shown in FIGURE 1, except that the hot end contact disk is omitted and different thermoelectric materials are used. The first portion, having graphite at either end, is then used as a male die plunger for a die containing the second portion in such a manner that the graphite cold end of the first portion abuts the graphite-free end of the second portion. Heating under pressure is then used to unite the two portions into an integral element having four segments of thermoelectric material, three graphite barrier layers serving as bonds, and two graphite contact ends.

Conveniently, for fabrication of the thermoelements, the graphite is usually employed in solid form, a piece suited to the shape of the die being readily cut from graphite sheeting. However, the graphite may also be used in comminuted form, whereby it is pressed into solid form during the hot-pressing of the segmented thermoelement or portions thereof. When employing comminuted rather than sheet graphite, good jointing is obtained, but some interpenetration of the thermoelectric material with the graphite will occur during the hot-pressing operation. Hence for obtaining thermoelements having constant, reproducible efficacy, it is preferred to use the preformed, solid graphite.

In order to obtain optimum bonding of the thermoelectric material to the graphite, it is advantageous to roughen one or both of the surfaces of the graphite which are to come into contact with the thermoelectric material. Thereby the contact area is increased and bond strength improved. The roughening may be done by abrading with a file, by grooving the surface in criss-cross fashion, etc. In large scale operation, discs of the graphite having one or both surfaces serrated may be pre-molded.

The nature of the thermoelectric material will determine the pressing conditions. Usually, best results are obtained by employing a temperature which is from, say, 30% to 200% of the melting point of the thermoelectric material. The pressure will depend, of course, on the temperature which is used. When the temperature approaches, say 200% of the melting point, a pressure as low as, say, 50 p.s.i. is sufficient. However, when the temperature is only about 30% of the melting point, a pressure of about 10,000 p.s.i. may be needed to obtain strong bonding within a reasonable pressing time. Generally, unitized products are obtained by heating at a temperature of at least 30% of the melting point, but below the decomposition point of the thermoelectric material at a pressure of from, say 30 p.s.i. to 15,000 p.s.i. for a time of say, from 10 minutes to one hour. Obviously, the conditions will vary not only with the thermal stability of the thermoelectric material but also with the size and shape of the desired thermoelement. Hence it is recommended that in experimental runs, a series of pressings under varying conditions of temperature and pressure be conducted in order to arrive at those which are best suited for the particular job at hand, since determination of optimum pressing conditions is arrived at by routine procedure and is well within the skill of the art.

The design of the thermoelement will, of course, depend upon the thermoelectric device for which it is intended and upon the thermoelectric materials used. In thermoelectric generating devices means of dissipating heat at the cold junction is critical and will play a significant role in arriving at the configuration of the element, the quantity of each thermoelectric material, and the dimension of the barrier layer. In order to follow the efficiency of the device, it is advantageous to be able to determine the temperature at various portions of the thermoelements. Use of a barrier layer which is sufficiently large to accommodate a thermocouple facilitates observation of the temperature along the element, since generally the graphite can be more readily machined than can the segments of the compressed thermoelectric materials.

The invention is further illustrated by, but not limited to, the following examples:

Example 1

Into a cylindrical graphite die fitted with a boron nitride liner there was placed a disc of graphite having a diameter of 0.375″ and a thickness of 0.5″, and on top of the disc there was charged about 1.1 g. (sufficient to give a solid, 0.250″ thick layer upon hot-pressing) of a finely comminuted p-type thermoelectric material designated as P–5 and consisting essentially of boron with a minor amount of carbon and p-type dopants. Another graphite disc of the same dimension as the first was serrated on one face by rubbing with a coarse emery cloth, and it was placed on top of the P–5 material, with serrated surface down, to serve as male ram of the die. After compacting, the loaded die was placed in an induction furnace and brought to a temperature of 2055° C. at a rate of about 200° C./minute from ambient while increasing the pressure to 4000 p.s.i. The die was held at the maximum temperature and pressure for about 8 minutes. During this cycle, the thermoelectric material reacted with the graphite to form continuously changing transition zones of reaction products, resulting in tenacious adherence of said material to the graphite. A strongly reducing carbon monoxide environment in the die, produced by partial oxidation of the die wall, protected the contents at the elevated temperatures. At the end of the pressing cycle the die with its contents was allowed to cool to ambient temperature under 1000 p.s.i. pressure at a rate of 200° C./minute. The now unitized segments of graphite, material P–5, and graphite was removed by cutting away the die and liner. The layer of P–5 had been compressed to a thickness of 0.25″. One of the graphite segments was machined to a ⅜″–24 thread in order to serve as hot junction for insertion into the heated block of a thermoelectric device. The other graphite segment was trimmed to a thickness of 0.10″ and serrated on its exposed face by rubbing with an 8″ double-cut bastard file in a direction parallel with its teeth to produce uniform grooves, and rotating the surface 90° and repeating the process. The outside of the entire, unitized piece was polished by grinding to serve as male ram in another hot-pressing operation which was conducted as follows. A die like the first die and lined in the same manner was loaded by first inserting into it a 0.50″ thick graphite disk having a diameter of 0.375″ and serrated at one face thereof by means of a file as described above. Upon the serrated face there was charged about 2.3 g. (sufficient to give a solidified 0.375″ layer) of a well comminuted thermoelectric material designated as P–4 and consisting of about equal parts by weight of germanium and silicon and a very minor proportion (about one percent of the P–4) of a mixture of boron and calcium oxide. The previously prepared and polished, unitized assembly of graphite, P–5, and graphite were then used as a male ram, the serrated, graphite face of the previously prepared unit being placed on top of the layer of P–4 material. The thus loaded die was placed in the furnace and the temperature was increased at a rate of 200° C./minute to maximum of 1360° C. After holding at this temperature for 5 minutes, the die and its contents was cooled to ambient at the rate of 200° C./minute. The pressure was increased with decrease of temperature, so that a maximum of 1000 p.s.i. was attained at about 1100° C. The cooled, now integrated piece, was freed from the die by cutting away the die and liner. The p-type thermoelement thus obtained is depicted in FIGURE 1, wherein element 11 is the hot contact end which has been threaded for insertion into a heated block (not shown) element 12 is the solidified layer of P–5 material, element 13 is a graphite barrier layer serving to unite element 12 to a solidified layer of P–4 material (depicted as element 14 in the drawing), and element 15 is the cold contact end. The thermoelement was a strong, well bonded piece which could not be crushed or broken by hand or upon dropping.

The electrical resistance of the thermoelement was found to be 0.0127 ohm, which value is substantially the sum of the thermoelectric materials alone. It was tested for efficacy by using it as one leg of a thermoelectric couple, whereby the threaded graphite end of the element was inserted into a graphite block which served as thermal conductor from a heat source, and the other graphite end of the element was exposed to the ambient. The temperature difference between the hot end and the cold end of the thermoelement was determined by means of a thermocouple positioned at each extremity. In operation, a temperature of 1206° C. was determined at the hot junction and 458° C. at the cold junction, thus showing a temperature difference, $\Delta T°$ C., of 748° C. The internal electrical resistance was found to be 0.0127 ohm. A power output of 0.252 watt and an open circuit voltage of 113.0 millivolts was obtained. At the end of the test, there was no evidence of deterioration.

An element of like diameter and having similarly proportioned graphite hot and cold conjunctions but consisting only of the thermoelectric material P–5 alone was found to have an internal electrical resistance of only 0.0058 ohm and to give a $\Delta T°$ C. value of only 359° C. and a power output of 52 millivolts and 0.116 watt. The thermoelectric material P–4 has too low a decomposition temperature to permit operation at the high temperatures which can be used with P–5. Therefore only much lower $\Delta T°$ values and consequently lower power output can be obtained with a thermoelement in which only this material is used as the thermoelectric. Use of both P–5 and P–4 is advantageous because high $\Delta T°$ values are thereby obtained, but in practice the materials P–5 and P–4 cannot be joined together by hot pressing in absence of the barrier layer because at the temperature required to fuse P–5, there occurs decomposition of P–4, and at temperatures which are below the decomposition point of P–4, no adhesion occurs between the P–5 and P–4 materials.

Example 2

This example shows fabrication of a segmented, graphite-bonded n-type thermoelement. Substantially the same procedure was employed as that used in Example 1, except that the thermoelectric materials were different and that the quantity of one of the thermoelectric materials was greater. Thus, for preparing the n-type element, instead of using the boron-carbon material P–5, there was used a material designated as N–6, and consisting of a well blended, finely comminuted mixture of silicon and carbon in about a 3:1 weight ratio with a minor amount (about 8% of the total N–6) of n-type dopants, e.g., thorium, cobalt and calcium compounds. The thermoelectric material N–6 was used in a quantity sufficient to give an 0.375″ layer upon hot-pressing. Instead of the thermoelectric material P–4, in this example there was used a material designated as N–4 and consisting of substantially equal parts of germanium and silicon with about 6% by weight of the N–4 of a mixture of n-type dopants, e.g., arsenic and thorium compounds. The N–4 material was used in a quantity sufficient to give an 0.375″ layer upon pressing. The finished thermoelement can also be illustrated by FIGURE 1, wherein element 11 is the graphite hot end contact, element 12 is the material N–6, element 13 is the graphite barrier layer and joint, element 14 is the material N–4, and element 15 is the graphite cold end contact.

Testing of this thermoelement as in Example 1, except that it was used as the n-type leg of a thermoelectric couple, gave an internal resistance of 0.0179 ohm, a hot end temperature of 1210° C. and a cold end temperature of 475° C. with a $\Delta T°$ C. value of 735, and an output of 161.8 millivolts and 0.286 watt.

In comparison, a similarly dimensioned thermoelement of only the N–6 as the thermoelectric but also having graphite hot and cold ends gives a ΔT° value of only 304° C. upon similar testing. A thermoelement wherein the only thermoelectric is N–4 cannot be used for operation at so high a temperature. A segmented element of N–6 and N–4 could not be prepared by hot-pressing the two materials together in absence of the graphite layer owing to the wide difference in thermal stability of the two, and attempts to bond the two materials by means of a metal barrier layer such as molybdenum or zirconium gave either no bonding or resulted in deterioration of the thermoelectric material to so great an extent that the resistance was increased to an impractical value.

Example 3

This example is like Examples 1 and 2, except that smaller thermoelements were fabricated. Thus there were made well-bonded units having the structure depicted in FIGURE 1, wherein the diameter of the elements 11–15 was 0.25" instead of 0.375" as in Examples 1 and 2, and the thickness of the graphite hot contact element 11 was 0.25", that of the P–5 or N–6 element 12 was 0.187", that of the graphite barrier layer element 13 was 0.15", that of the P–4 or N–4 element 14 was 0.375", and that of the cold contact end 15 was 0.5". An internal electrical resistance of 0.01909 ohm was determined for the p-type thermoelement and 0.03893 ohm for the n-type thermoelement. Testing of the thermoelements as described in Example 1 gave an open circuit voltage of 111.6 millivolts and 0.163 watt for the p-type element, and an open circuit voltage of 146.0 millivolts and 0.136 watt for the n-type element.

Example 4

This example shows testing, over a long period of time, of a thermocouple in which each of the n- and p-type elements consists of two segments of different thermoelectric materials with graphite bonding and graphite contacts.

The thermoelements were fabricated by the procedure described in Example 1, except that none of the graphite portions was serrated. The p-type element of this example is represented by FIGURE 1 of the drawings when element 11 is an 0.5" thick hot contact end of graphite, element 12 is an 0.5" thick segment of the p-type thermoelectric material P–5 described in Example 1, element 13 is an 0.15" thick layer of graphite, element 14 is an 0.5" segment of the p-type thermoelectric material described in Example 1 and element 15 is an 0.5" thick cold contact of graphite. The n-type element of this example is represented by FIGURE 1 when all of the elements 11–15 are of the same thicknesses as in the p-type element of this example, elements 11, 13 and 15 are graphite, element 12 is the n-type thermoelectric material N–6 described in Example 1 and element 14 is the n-type thermoelectric material N–4 described in Example 1. Both of the elements had a diameter of 0.375".

Figure 2:
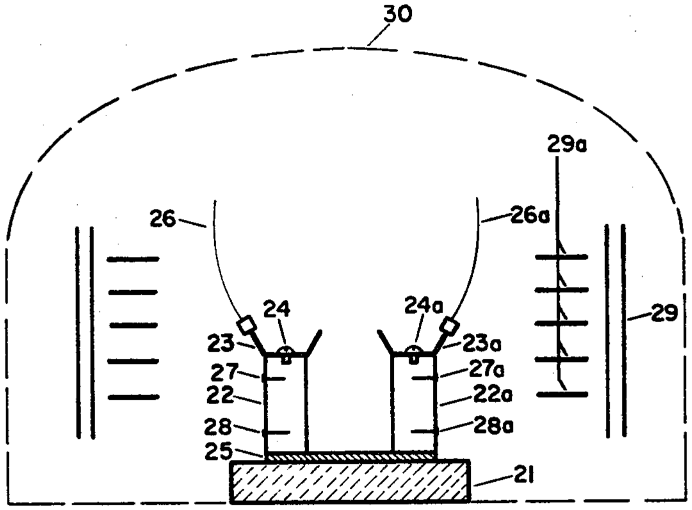

The thermoelements of this example were used in the thermocouple depicted in FIGURE 2 of the drawings, wherein element 21 is a uniformly heated graphite base, element 22 is the p-type thermoelement of this example through which heat is conducted to a copper, winged shaped radiator 23 (⅝" wide, 1¾" long) fixed to element 22 by means of metallic screw 24 to insure good contact between rod 22 and radiator 23, element **22*a* is the n-type thermoelement of this example which is joined at its hot end to the hot end of element 22 by means of a molybdenum strap 25, element 23*a* is a wing-shaped copper radiator of the same construction as radiator 23 connected by means of screw 24*a* to element 22*a*, elements 26 and 26*a* are electrical leads used to conduct the generated power to an approximately matched resistive load (not shown) element 27 and 27*a* are thermocouples for measuring the cold end temperatures, elements 28 and 28*a* are thermocouples for measuring the hot end temperatures, and elements 29 and 29*a* are insulating shields used to minimize the amount of heat which would be otherwise transferred from the heated base 21 to the sides of housing 30**. The thermocouple thus constructed was subjected to continuous operation for 1036 hours in a vacuum of $0.40–0.95 \times 10^{-5}$ mm. Hg with its hot end at temperatures of approximately 1200° C. and its cold end near 500° C. Cooling was accomplished only by heat radiation rejected to ambient environmental temperatures of 20–30° C. The efficacy of the thermocouple is shown by the following results at the indicated hours of operation under an approximately matched load:

| Hrs. of operation | Av. ΔT., °C. | Current, amps. | Potential, mv. | Power, watts | Internal Resistance, ohms |
|---|---|---|---|---|---|
| 24 | 677 | 3.70 | 148.1 | 0.548 | 0.0346 |
| 72 | 687 | 3.68 | 154.9 | 0.570 | 0.0346 |
| 144 | 690 | 3.72 | 158.9 | 0.592 | 0.0336 |
| 288 | 692 | 3.67 | 165.1 | 0.605 | 0.0339 |
| 432 | 693 | 3.69 | 165.8 | 0.612 | 0.0337 |
| 480 [1] | 694 | 4.42 | 141.9 | 0.627 | 0.0334 |
| 552 | 693 | 4.43 | 142.4 | 0.631 | 0.0333 |
| 696 | 695 | 4.41 | 143.0 | 0.631 | 0.0335 |
| 844 | 700 | 4.38 | 143.8 | 0.630 | 0.0340 |
| 988 | 699 | 4.38 | 143.5 | 0.629 | 0.0336 |
| 1,036 | 703 | 4.40 | 144.2 | 0.634 | 0.0339 |

[1] Load on generator at this point was changed to permit a better match between external load and internal resistance of the couple.

It is evident from the above data that the steady operation of the thermocouple indicates no deterioration of the thermoelements during the period of study. This is indicated, of course, by the constancy of the internal resistance values and power output. In order to further show that no change in the thermoelements was caused during operation, open-circuit voltages were also observed and the values thus obtained were divided by the average temperature differences (ΔT° C.) between the hot and cold ends. The following results were obtained:

| Hours of Operation | Av. ΔT., ° C. (1) | Open circuit potential, mv. (2) | (1)/ 2) |
|---|---|---|---|
| 24 | 677 | 276.2 | 408.1 |
| 72 | 687 | 282.4 | 411.0 |
| 144 | 690 | 283.6 | 411.0 |
| 288 | 692 | 289.5 | 416.8 |
| 432 | 693 | 289.9 | 417.5 |
| 480 | 694 | 289.7 | 417.5 |
| 552 | 693 | 290.6 | 417.5 |
| 696 | 695 | 290.9 | 418.6 |
| 844 | 700 | 292.9 | 416.9 |
| 988 | 699 | 291.1 | 416.5 |
| 1,036 | 703 | 293.2 | 417.1 |

The fact that (1)/(2) above remains quite constant for the entire 1036-hour test period indicates that there occurred no substantial change in the thermoelectric materials owing to sublimation or solid-state diffusion.

Example 5

Figure 3:
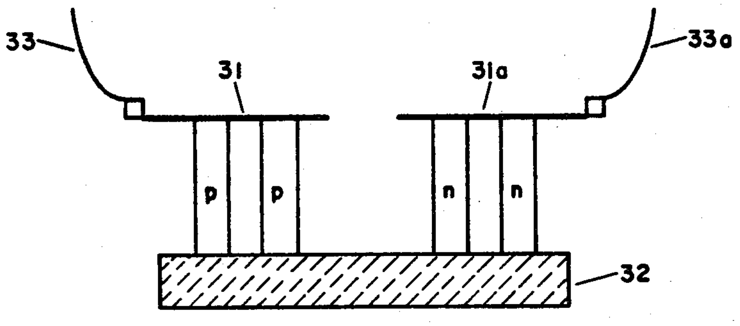

This example is like Example 4, except that a 4-element p-n module was used to test the thermoelements described in Example 4. The 4-element module consisted of two p-type and two n-type thermoelements connected in parallel as shown in FIGURE 3 by means of strips 31 and **31*a* (0.5" x 1.5" x 0.01") of a thermal and electrical conducting metal such as copper mounted across the top of the cold end of each pair of the elements to serve as electrical connector and as radiator. The hot ends of the elements were connected in series by means of the graphite block 32 exposed to a heat source (not shown). As in the case of the 2-element module of Example 5, thermocouples were installed at the cold and hot ends of each thermoelement. Electrical leads 33 and 33*a* from the radiator strips 31 and 31*a*** leads to a load (not shown). The following results were obtained over an operating period of 282 hours.

| Hours of Operation | Av. ΔT., ° C. | Under approximately matched load | | | |
|---|---|---|---|---|---|
| | | Current, amp. | Potential, mv. | Power, watts | Internal Resistance, ohms |
| 1 | 741 | 9.67 | 161.3 | 1.560 | 0.0169 |
| 41 | 741 | 9.66 | 160.9 | 1.550 | .0171 |
| 113 | 738 | 9.50 | 166.6 | 1.580 | .0168 |
| 185 | 745 | 9.50 | 169.1 | 1.610 | .0173 |
| 282 | 744 | 9.68 | 171.1 | 1.660 | .0171 |

Here, as with the 2-element thermocouple of Example 4, the power output of the module remained relatively steady with time; but, even with allowances for the higher ΔT's across the thermoelements as compared with ΔT's on the 2-element couple, the power output per thermoelement was somewhat higher.

Example 6

Figure 4:
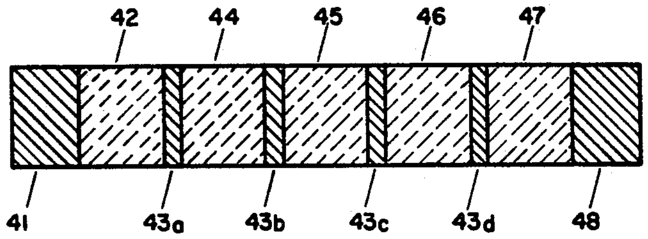

Segmented thermoelements are also conveniently made by using separate dies to make portions having two or more segments in each portion and then uniting the portions. Thus, FIGURE 4 shows an element having segments of five different thermoelectric materials. It is made by inserting the hot junction component 41 consisting of a heat resistant iron/chromium/aluminum alloy, into a graphite die which is lined with boron nitride, then charging thermoelectric material 42 on the top surface of 41. Material 42 may be a powdered mixture of boron, germanium and carbon in, say, a 10:1:0.01 weight ratio. The graphite barrier layer **43*a* is placed on top of material 42 and used as male die plunger to compact it. A layer of powdered silicon carbide 44 is charged on top of graphite barrier 43*a*. A second graphite barrier, element 43*b*, is then placed on material 44 and used as a plunger as before. A third thermoelectric material 45 consisting of a well-blended mixture of boron, germanium and silicon in, say, a 10:1.5:0.03 weight ratio, is placed on top of element 43*b*. One surface of the graphite sheet 43*c* is serrated by scratching it with a file and it is placed on the compacted material 45, with the serrated surface up. Then the three thermoelectric elements, the three barriers and hot junction component are formed into an integral piece by placing the assembly while still in the graphite die, into an induction coil assembly and heating to a maximum temperature of about 1400° C. while holding under a maximum pressure of 5000 p.s.i. for about 5 minutes. The die and its contents are allowed to cool. Into another die there is charged powdered bismuth telluride 46 and after compacting, graphite barrier 43d is placed on top of the compacted material 46. A layer of powdered lead selenide 47 is placed on top of barrier 43*d* and covered with the graphite cold end contact 48. This assembly is pressed into an integral unit by pressing at a temperature at about 500° C. at 4000 p.s.i. After cooling, the unit is removed from its die and placed in the die which contains the unitized assembly of elements 41–45, with element 46 being placed on top of the serrated surface of barrier layer 43*c*. The die which now contains a unitized portion consisting of elements 41–43*c* and a unitized portion consisting of elements 46–48**, is placed in a resistance-wire-wound furnace assembly and heated at 100° C. and a pressure of 4000 p.s.i. to give the strong, well-bonded thermoelement shown in FIGURE 4. It has a hot end junction of the iron alloy and a cold end junction of graphite and consists of five different thermoelectric materials joined together by means of graphite which serves not only as a bond for all the segments but also as a diffusion barrier.

EXAMPLE 7

Figure 5:
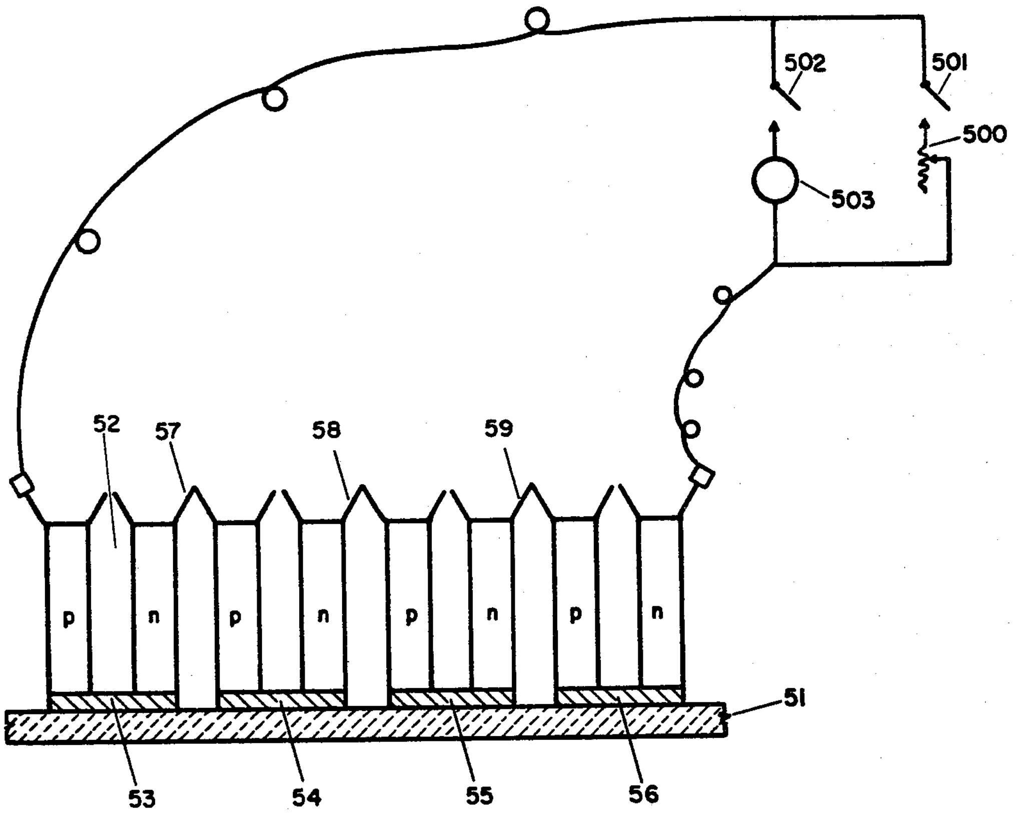

In another embodiment of the invention, the p-type and n-type thermoelements of Example 4 are assembled to give either a power generator or a cooling device, as shown in FIGURE 5. Element 51 represents an electrical insulating but thermally conducting hot wall of a nuclear or chemical reactor, exhaust manifold, pipe or other unit which it is desirable to cool or from which heat can be absorbed for the purpose of converting to electricity. Element 52 represents an air or vacuum gap or electrically and thermally insulating material between each p-n thermoelement or leg. Elements 53, 54, 55 and 56 represent individual hot junction straps between each p-n combination. Elements 57, 58 and 59 represent individual cold junctions between each n-p combination. Said junctions comprise a strap or sheet of electrically and thermally conducting metal, e.g., graphite or molybdenum at the hot ends, and copper or beryllium at the cold ends. These straps are fixed to each of the two members of the p-n combination by a thermally and electrically conductive adhesive or screw. The cold junctions are outwardly finned between each of the n-p combinations. That surface of the cold junction strap or sheet which is presented to the ambient may have bonded to it an emissive coating of, say, black lead oxide.

Elements 57, 58 and 59 serve both as electrical conductors and as radiators, heat being removed from said elements by radiation cooling. When the unit is to serve as energy converter, load 500 is connected through switch 501 with switch 502 open. To generate electricity, a heat source is directed at element 51, through which the heat flows to the individual hot junctions 53, 54, 55 and 56, then through each p and n leg and thence through cold junctions 57, 58 and 59. Thermal energy is converted to electrical energy when the thermal energy flows through the p and n legs of the device. This electrical energy can then be used to operate load 500.

When the unit is to be used as a cooling device, switch 501 is opened and switch 502 is closed, connecting the unit in series with a power source 503 which causes current to flow in a reverse direction to that of the flow when the unit produces electric power. By reversing the direction of current used for cooling, the unit will supply heat at the previously cool part of the device and cooling at the previously hot end of the device. Thus, the device can be used for heating or cooling, depending on the direction of current flow from power source 503.

Thermoelectric devices of the type shown in FIGURE 5 are particularly useful for generating power when such a device is installed as a part of the exhaust system of autos, planes, boats, rockets and other systems where waste heat in excess of, say, 400° C. is available.

In the design of thermoelectric devices, particularly for use in space where generators of minimum weight must be used, it is especially important to have available not only thermoelectric units capable of operation at high temperatures, but also thermoelements having a high strength/weight ratio and capable of long-lived operation. Use of graphite as the bonding for segments of thermoelectric materials meets these requirements and permits the design and fabrication of thermoelectric cooling and heating devices and power generating units with higher watt per pound ratios than is possible when conventional non-segmented elements or elements wherein prior cements or solders are used for bonding segments of diverse thermoelectric materials.

The graphite bonded thermoelements may be made in wafer form, particularly in the fabrication of solar cells wherein surface areas for collection of radiant energy are complemented by surface areas of emittance.

The presently provided segmented thermoelements are useful in thermoelectric apparatus generally, e.g., in power generators, cooling units, and in all devices, including thermionic units or diodes and fuel cells where a power generating assembly requires gradation in temperature. Hence, the above examples and accompanying drawings are intended by way of illustration only. It will be obvious to those skilled in the art that many variations are possible within the spirit of the invention, which is limited only by the appended claims.

We claim:

1. A segmented thermoelement consisting essentially of a graphite cold end and a graphite hot end and, interposed therebetween and integral with said ends, two segments of thermoelectric material having different temperature to figure of merit ratios and a thin layer of graphite interposed between at least two of the segments, said layer providing both a thermal shock resistant bond with said segments and a barrier which essentially prevents migration of thermoelectric material from one segment to another of said segments.

2. The thermoelement defined in claim 1, further limited in that one of said segments consists predominantly of silicon, carbon and an n-type dopant.

3. The thermoelement defined in claim 1, further limited in that one of said elements consists predominantly of germanium, silicon and a p-type dopant.

4. The thermoelement defined in claim 1, further limited in that one of said segments consists predominantly of germanium and silicon and an n-type dopant.

5. The thermoelement defined in claim 1, further limited in that one of said segments consists essentially of boron, carbon and a p-type dopant and the other of said segments consists essentially of germanium, silicon and a p-type dopant.

6. The thermoelement defined in claim 1, further limited in that one of said segments consists essentially of silicon, carbon and an n-type dopant and the other of said segments consists essentially of germanium, silicon and an n-type dopant.

7. A segmented thermoelement wherein each segment of thermoelectric material has a different temperature to figure of merit ratio and wherein a segment is bonded to another segment by a thin layer of graphite, wherein one of said segments consists predominantly of boron, carbon and a p-type dopant and the other one of said segments consists predominantly of germanium, silicon and a p-type dopant, said layer serving not only to bond the one segment to the other segment but also to essentially prevent migration of thermoelectric material from one segment to another segment.

8. A thermoelectric device comprising the thermoelement defined in claim 7.

9. A segmented thermoelement wherein each segment of thermoelectric material has a different temperature to figure of merit ratio and wherein a segment is bonded to another segment by a thin layer of graphite, wherein one of said segments consists essentially of silicon, carbon and an n-type dopant and the other one of said segments consists essentially of germanium, silicon, and an n-type dopant, said layer serving not only to bond the one segment to the other segment but also to essentially prevent migration of thermoelectric material from one segment to another segment.

10. A thermoelectric device comprising the thermoelement defined in claim 9.

11. The method of fabricating a segmented thermoelement which comprises charging to a first die a first thin layer of graphite, a first layer of a thermoelectric material consisting essentially of boron, carbon and a p-type dopant and a second thin layer of graphite, subjecting the charged die to pressure at a temperature sufficient to fuse or sinter said material and insufficient to decompose it to obtain a laminate, charging a second die with a third thin layer of graphite, a layer of second thermoelectric material consisting essentially of germanium, silicon and a p-type dopant, having a temperature to figure of merit ratio which differs from that of the first layer of thermoelectric material, and subjecting the second charged die to pressure at a temperature sufficient to fuse or sinter the second thermoelectric material but insufficient to fuse or sinter the first thermoelectric material and also insufficient to decompose the first and second thermoelectric materials.

12. The method of fabricating a segmented thermoelement which comprises charging to a first die a first thin layer of graphite, a first layer of a thermoelectric material consisting essentially of silicon, carbon and an n-type dopant and a second thin layer of graphite, subjecting the charged die to pressure at a temperature sufficient to fuse or sinter said material and insufficient to decompose it to obtain a laminate, charging a second die with a third thin layer of graphite, a layer of second thermoelectric material consisting essentially of germanium, silicon and an n-type dopant having a temperature to figure of merit ratio which differs from that of the first layer of thermoelectric material, and subjecting the second charged die to pressure at a temperature sufficient to fuse or sinter the second thermoelectric material but insufficient to fuse or sinter the first thermoelectric material and also insufficient to decompose the first and second thermoelectric materials.

References Cited

UNITED STATES PATENTS

| | | | |
|---|---|---|---|
| 2,229,481 | 1/1941 | Telkes | 136—236 X |
| 3,051,767 | 8/1962 | Fredrick et al. | 136—205 X |
| 3,087,002 | 4/1963 | Henderson et al. | 136—238 X |
| 3,182,102 | 5/1965 | Simnad. | |
| 3,198,714 | 8/1965 | Johnson et al. | 23—209.2 X |
| 3,256,701 | 6/1966 | Henderson | 136—239 X |
| 3,279,954 | 10/1966 | Cody et al. | 136—205 |

FOREIGN PATENTS

| | | |
|---|---|---|
| 725,053 | 3/1955 | Great Britain. |
| 907,901 | 10/1962 | Great Britain. |

OTHER REFERENCES

Brophy, J. J., et al.: Organic Semiconductors, N.Y., The McMillan Co., 1962, article by C. A. Klein, "Electrical Properties of Pyrolytic Graphite," only pp. 190, 191, 208 and 212 relied upon.

ALLEN B. CURTIS, *Primary Examiner.*